(12) United States Patent
Gibbons

(10) Patent No.: US 8,039,327 B2
(45) Date of Patent: *Oct. 18, 2011

(54) TRANSISTOR FORMING METHODS

(75) Inventor: Jasper Gibbons, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 33 days.

This patent is subject to a terminal disclaimer.

(21) Appl. No.: 12/606,048

(22) Filed: Oct. 26, 2009

(65) Prior Publication Data

US 2010/0075473 A1    Mar. 25, 2010

Related U.S. Application Data

(63) Continuation of application No. 12/234,438, filed on Sep. 19, 2008, now Pat. No. 7,608,495.

(51) Int. Cl.
*H01L 21/84* (2006.01)

(52) U.S. Cl. .......................... 438/164; 438/151; 438/163

(58) Field of Classification Search .................. 438/149, 438/151–154, 163–165
See application file for complete search history.

(56) References Cited

U.S. PATENT DOCUMENTS

| | | |
|---|---|---|
| 6,635,909 B2 | 10/2003 | Clark et al. |
| 6,830,953 B1 | 12/2004 | Hu et al. |
| 6,869,868 B2 | 3/2005 | Chiu et al. |
| 7,026,199 B2 | 4/2006 | Lee |
| 7,033,869 B1 | 4/2006 | Xiang et al. |
| 7,317,230 B2 | 1/2008 | Lee et al. |
| 7,504,678 B2 | 3/2009 | Chau et al. |
| 7,608,495 B1* | 10/2009 | Gibbons ........................ 438/164 |
| 2006/0022239 A1 | 2/2006 | Mouli |
| 2006/0234438 A1 | 10/2006 | Yang et al. |
| 2007/0004129 A1 | 1/2007 | Lee et al. |
| 2007/0111455 A1 | 5/2007 | Kim et al. |
| 2007/0134860 A1 | 6/2007 | Yang et al. |
| 2008/0048262 A1 | 2/2008 | Lee et al. |
| 2008/0099850 A1 | 5/2008 | Jeon et al. |

FOREIGN PATENT DOCUMENTS

WO    2008026859 A1    3/2008

OTHER PUBLICATIONS

Dobkin, Daniel M., "Films for Self-Aligned Contacts" http://www.enigmatic-consulting.com/semiconductor_processing/selected_shorts/Self_aligned_contacts.html, downloaded Jul. 8, 2006, 9 pages.

(Continued)

*Primary Examiner* — Kevin M Picardat
(74) *Attorney, Agent, or Firm* — Wells St. John P.S.

(57) ABSTRACT

A transistor forming method includes forming a dielectric spacer in a trench surrounding an active area island, forming line openings through the spacer, and forming a gate line extending through the line openings, over opposing sidewalls, and over a top of the fin. Source/drain regions are in the fin. Another method includes forming an interlayer dielectric over areas of the fin intended for source/drain regions, forming contact openings through the interlayer dielectric, and forming a source/drain plug in contact with an exposed portion of the spacer and in electrical connection with the top, one of opposing endwalls, and both of the opposing sidewalls of the fin.

20 Claims, 18 Drawing Sheets

OTHER PUBLICATIONS

Park, Jong-Man et al., "Fully Integrated Advanced Bulk FinFETs Architecture Featuring Partially-Insulating Technique for DRAM Cell Application of 40nm Generation and Beyond", Journal Paper published Dec. 11-13, 2006, 4 pages.

Tanaka, Katsuhiko et al., "Source/Drain Optimization of Double Gate FinFET Considering GIDL for Low Standby Power Devices", IEICE Trans. Electron., vol. E90-C, No. 4, Apr. 2007, pp. 842-847.

Trivedi, Vishal et al., "Nanoscale FinFETs With Gate-Source/Drain Underlap", IEEE Transactions on Electron Devices, vol. 52, No. 1, Jan. 2005, pp. 56-62.

\* cited by examiner

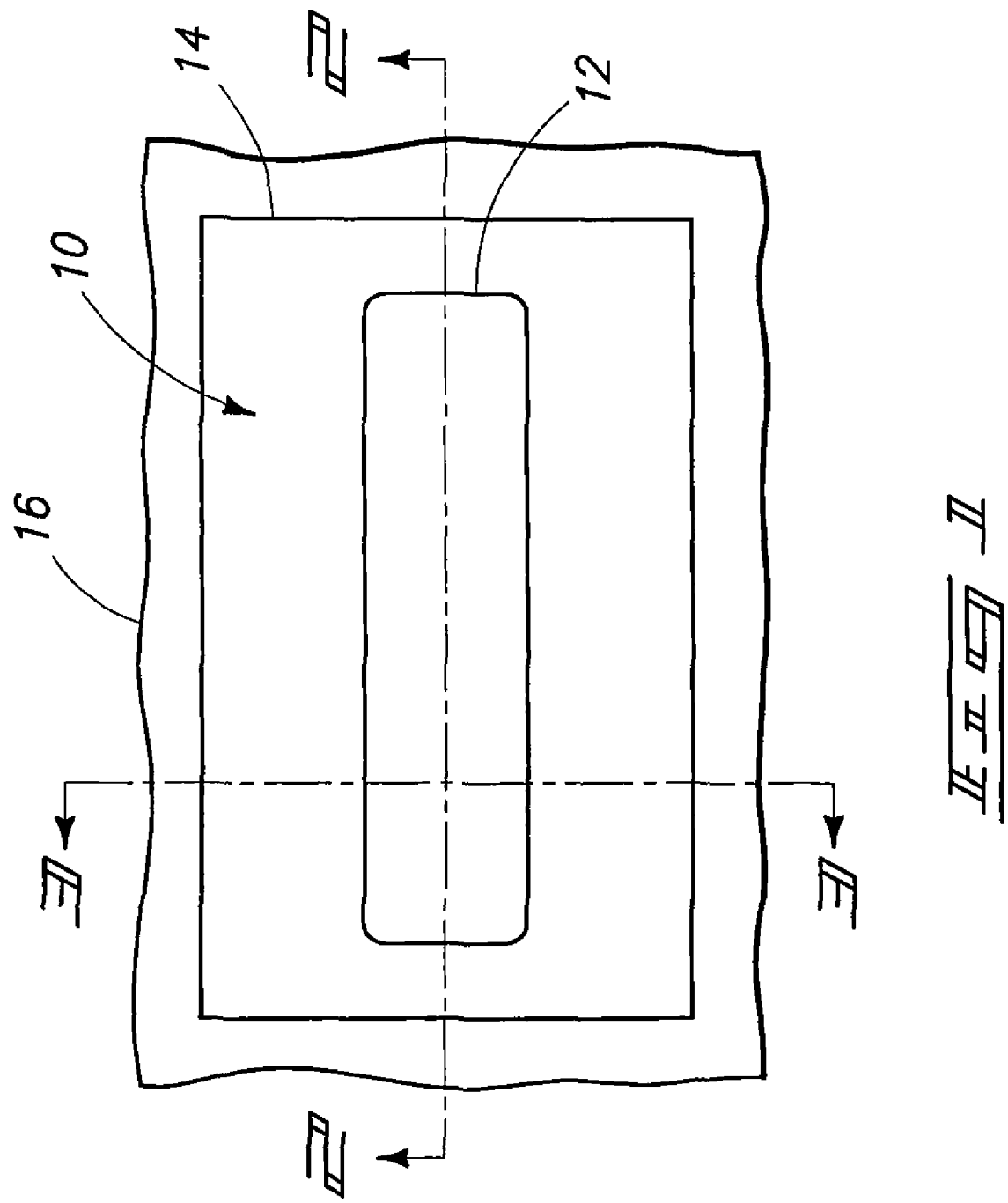

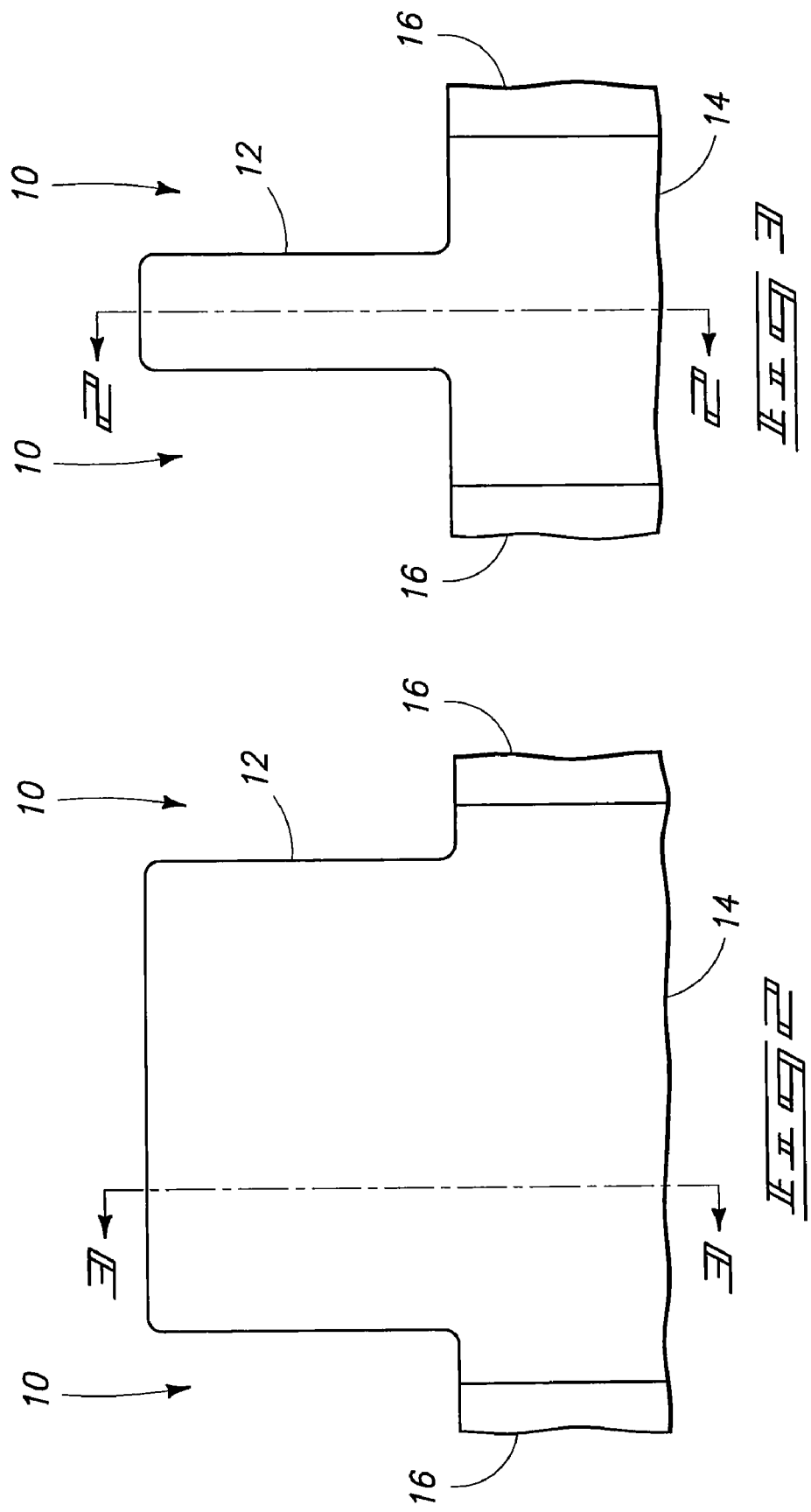

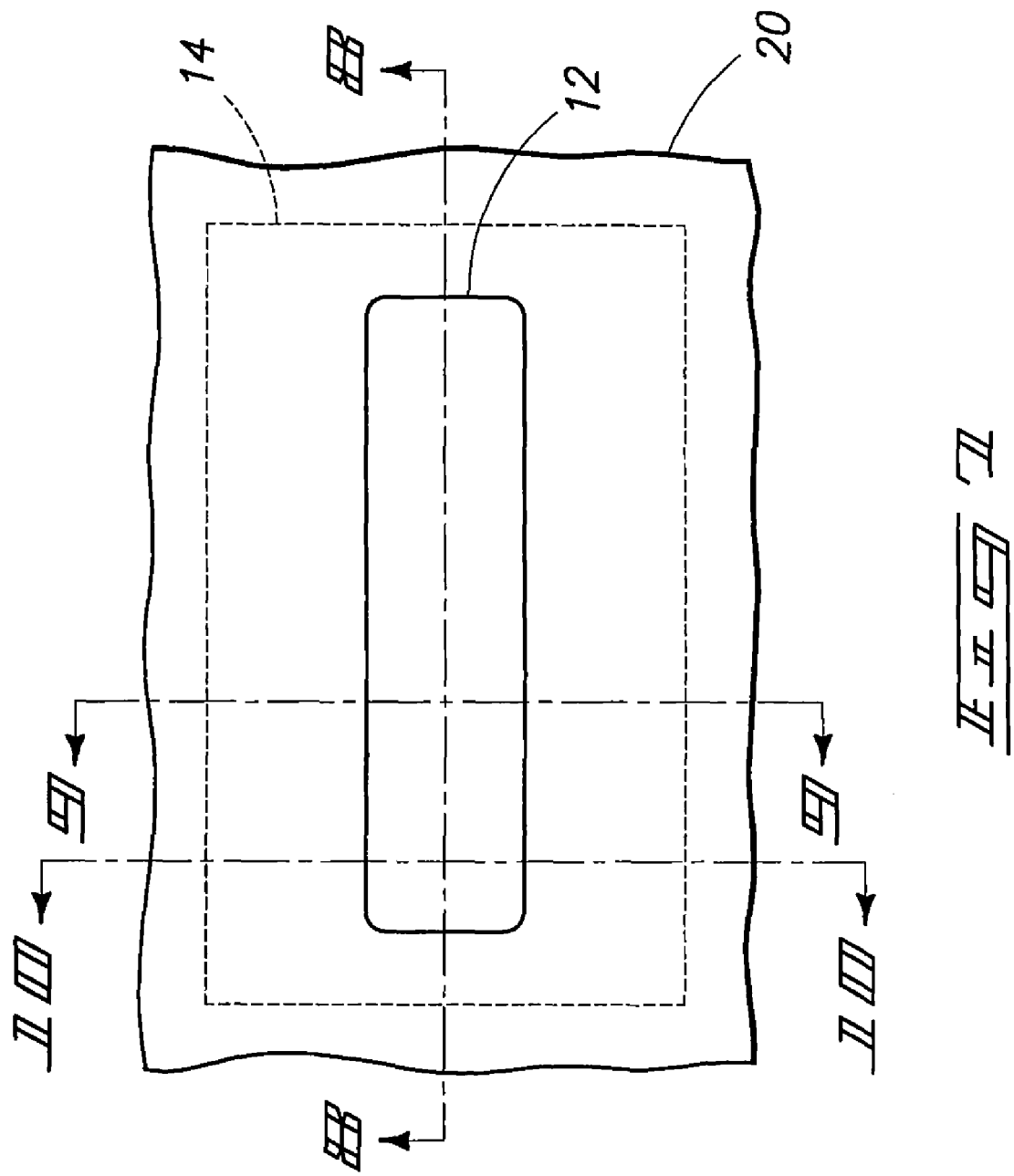

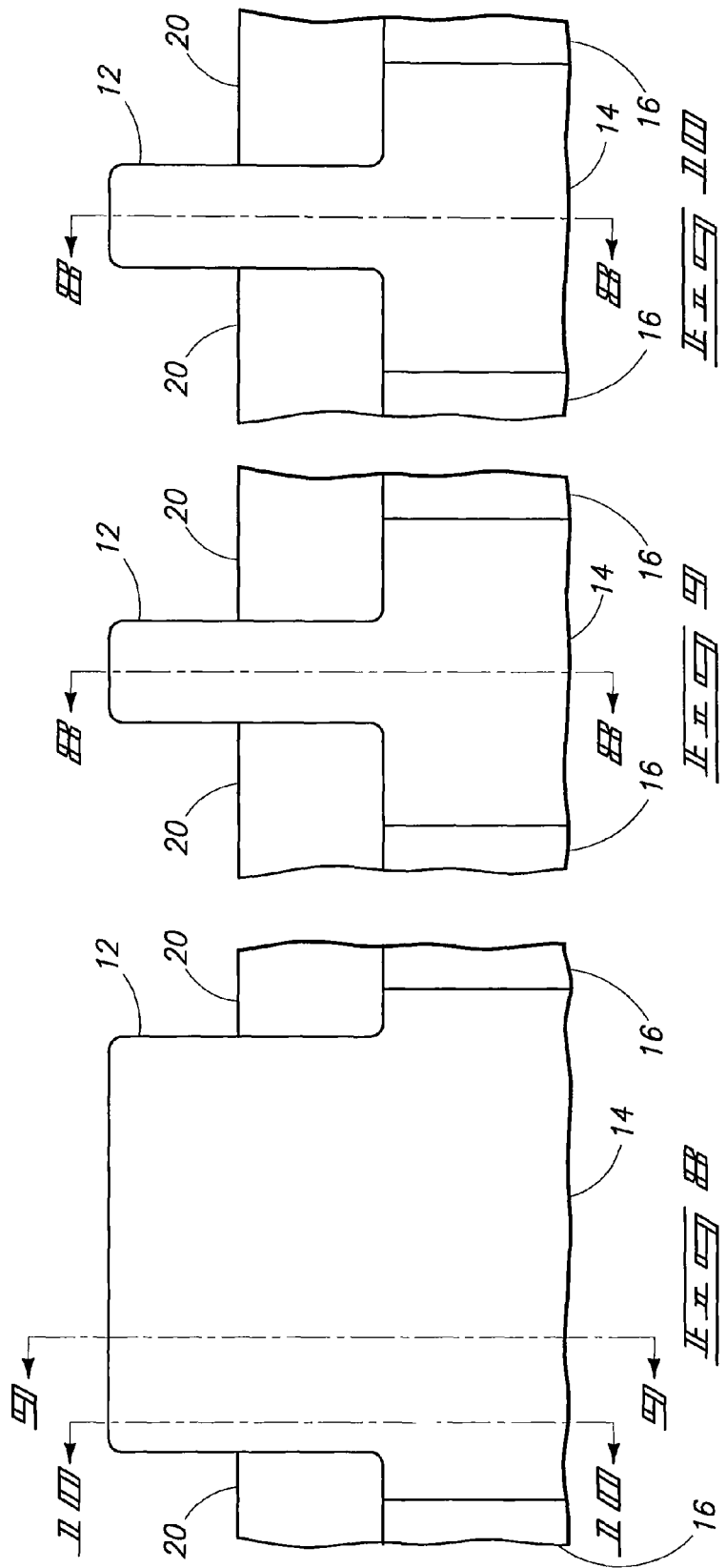

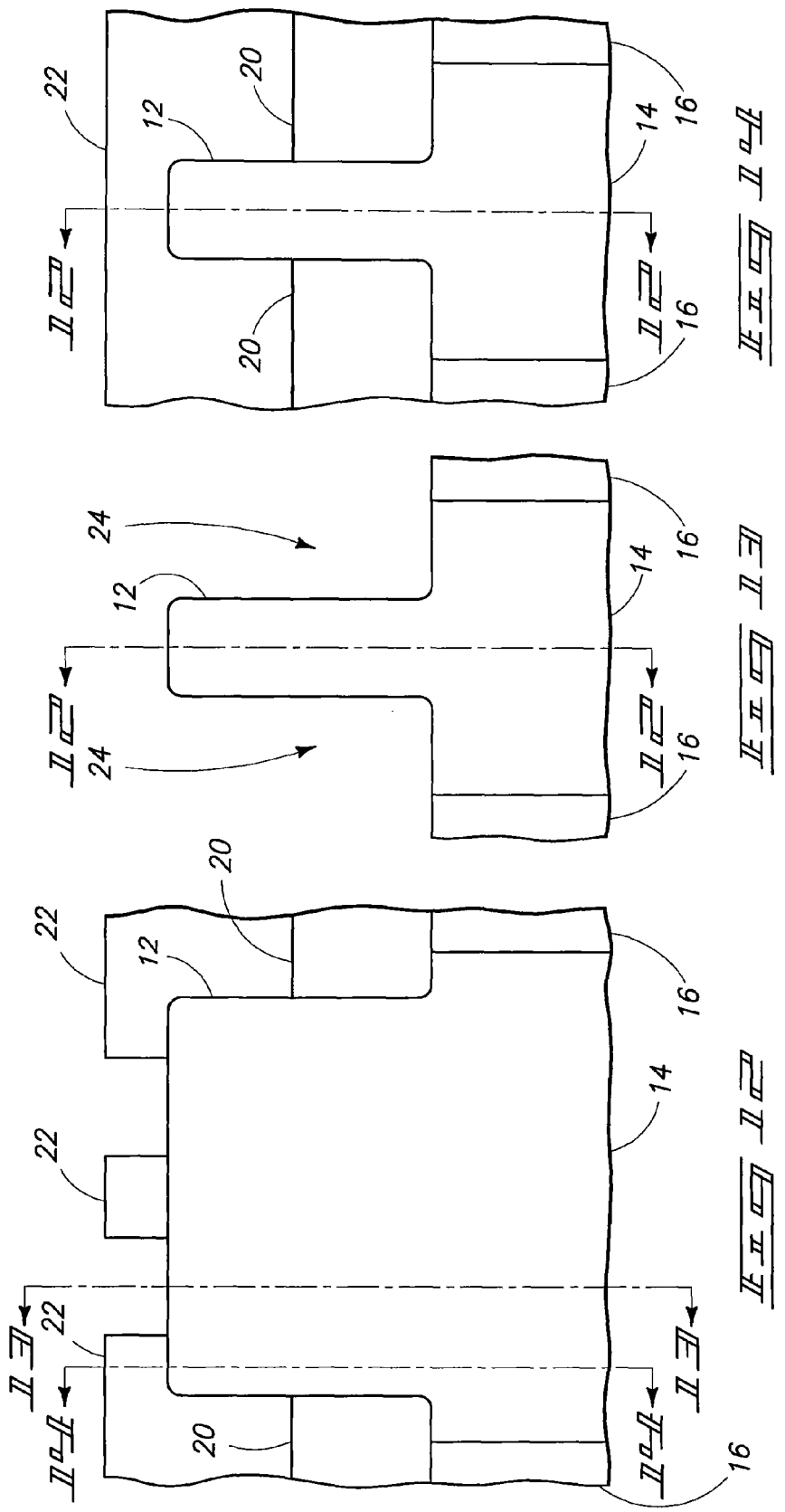

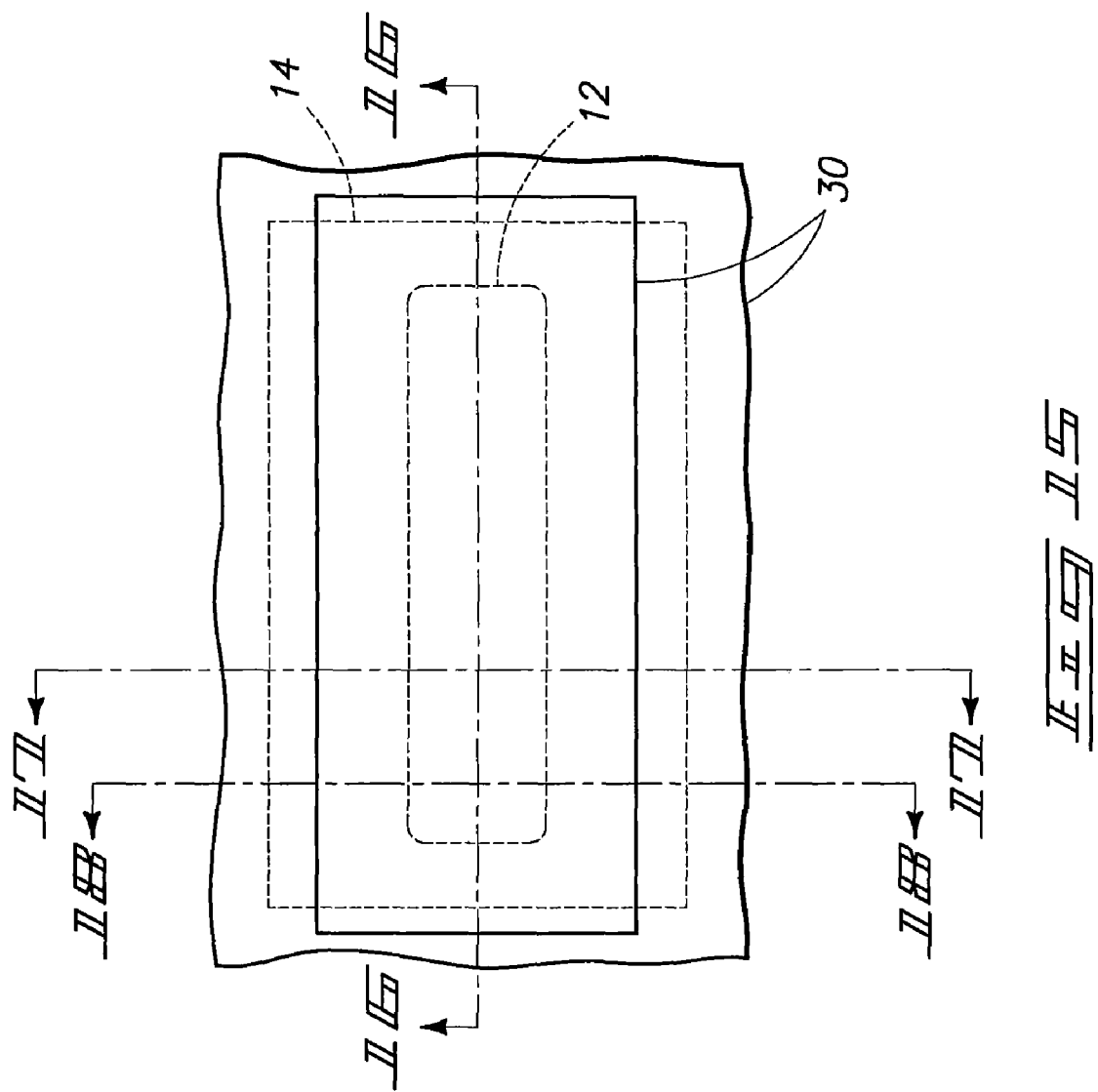

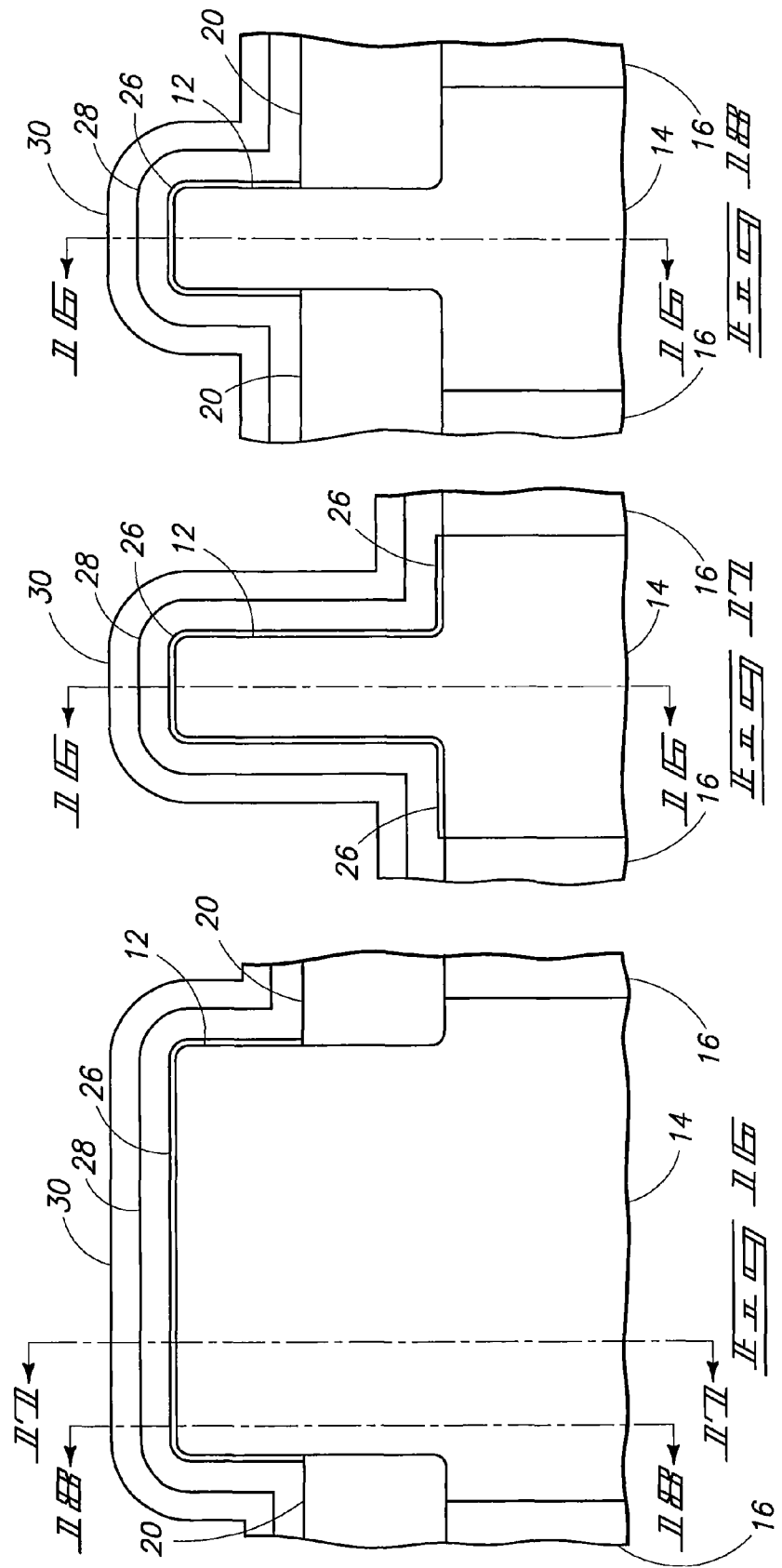

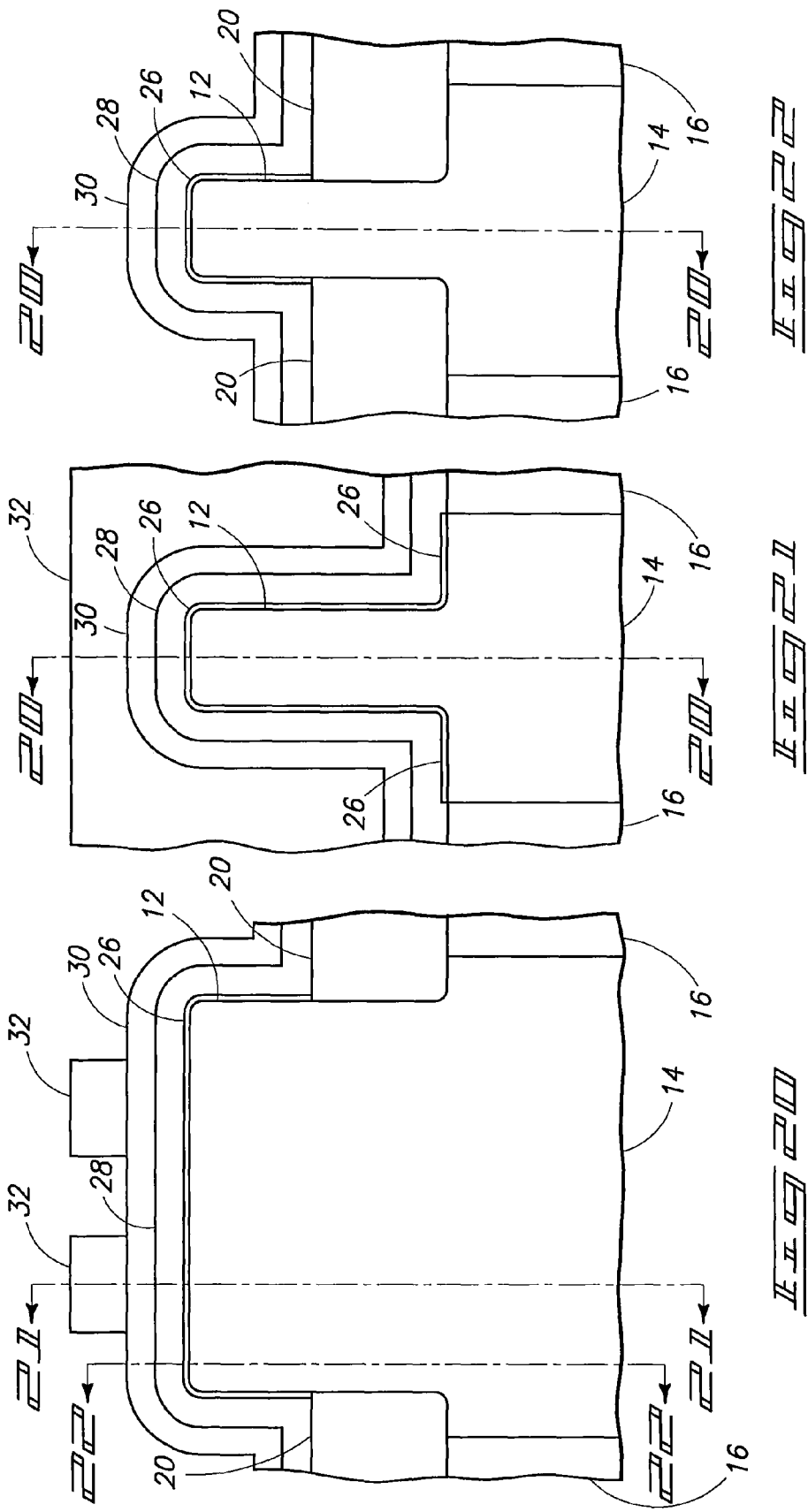

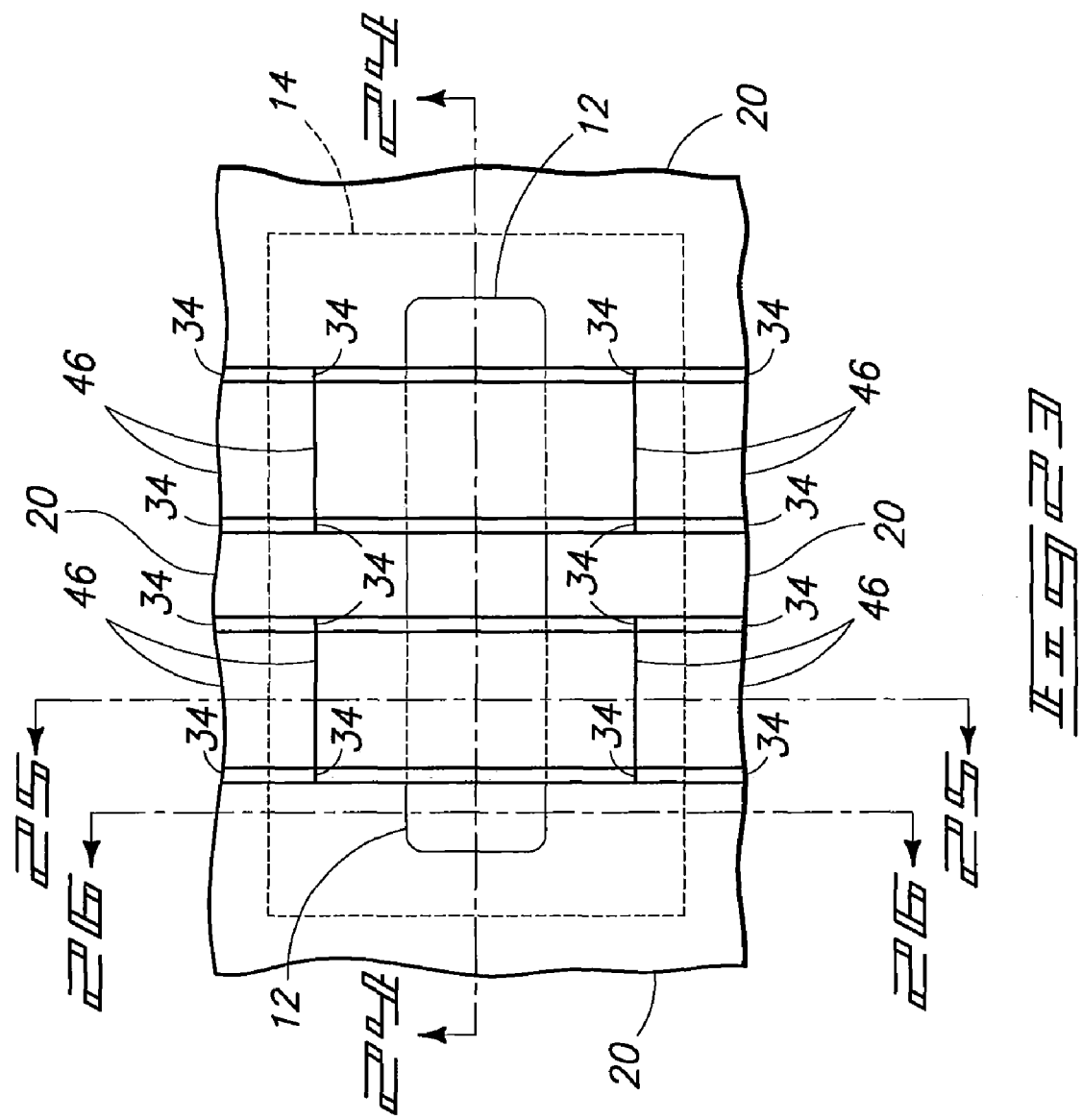

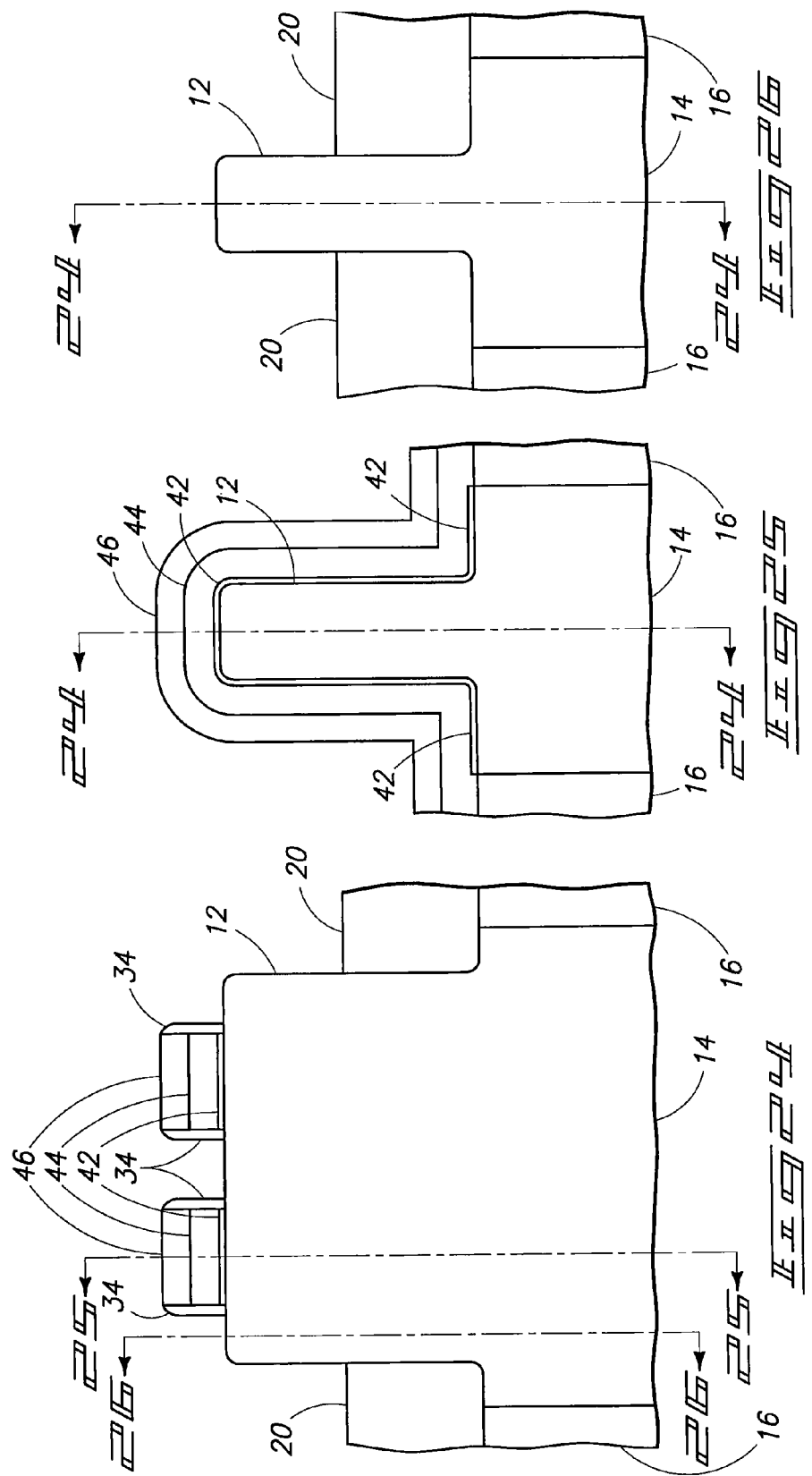

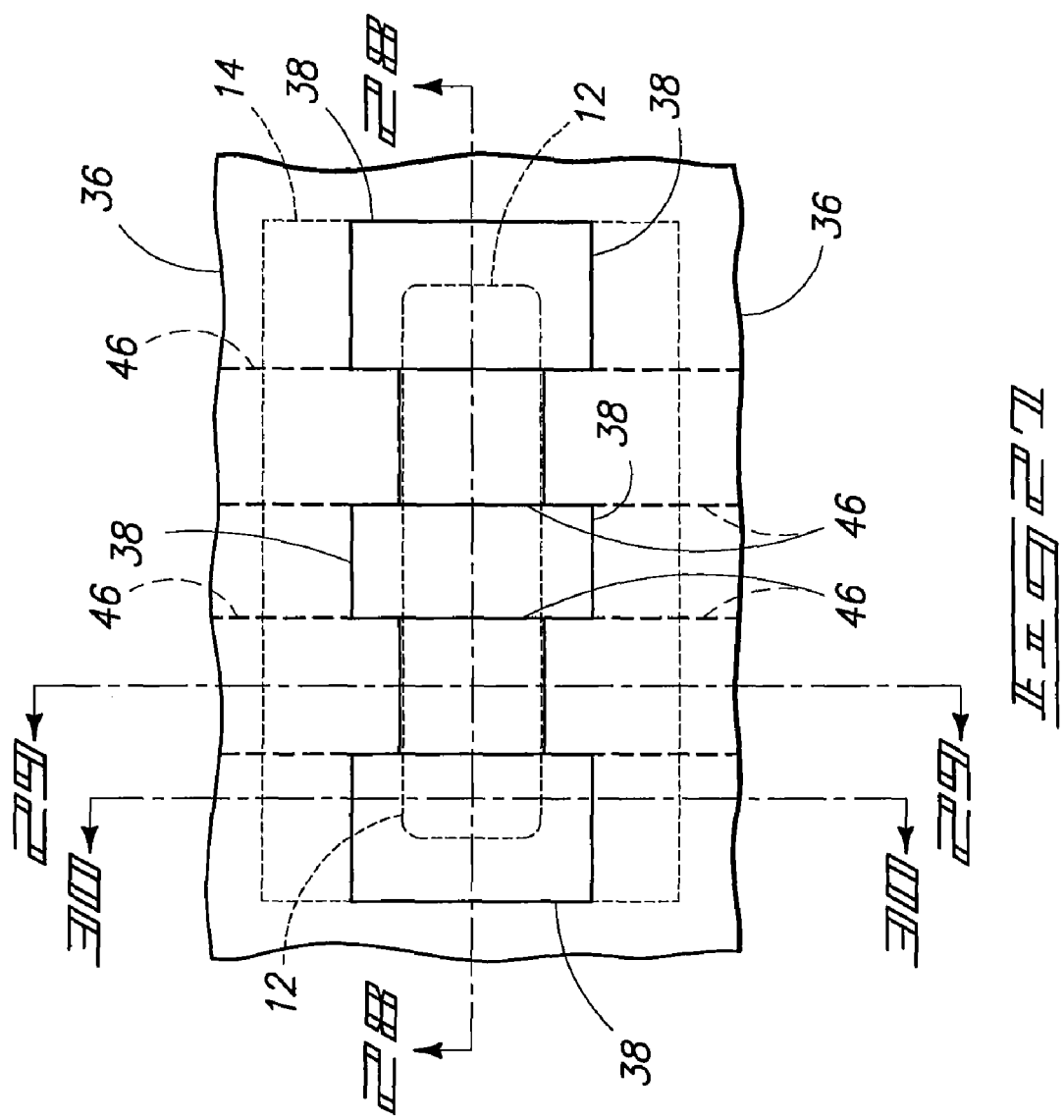

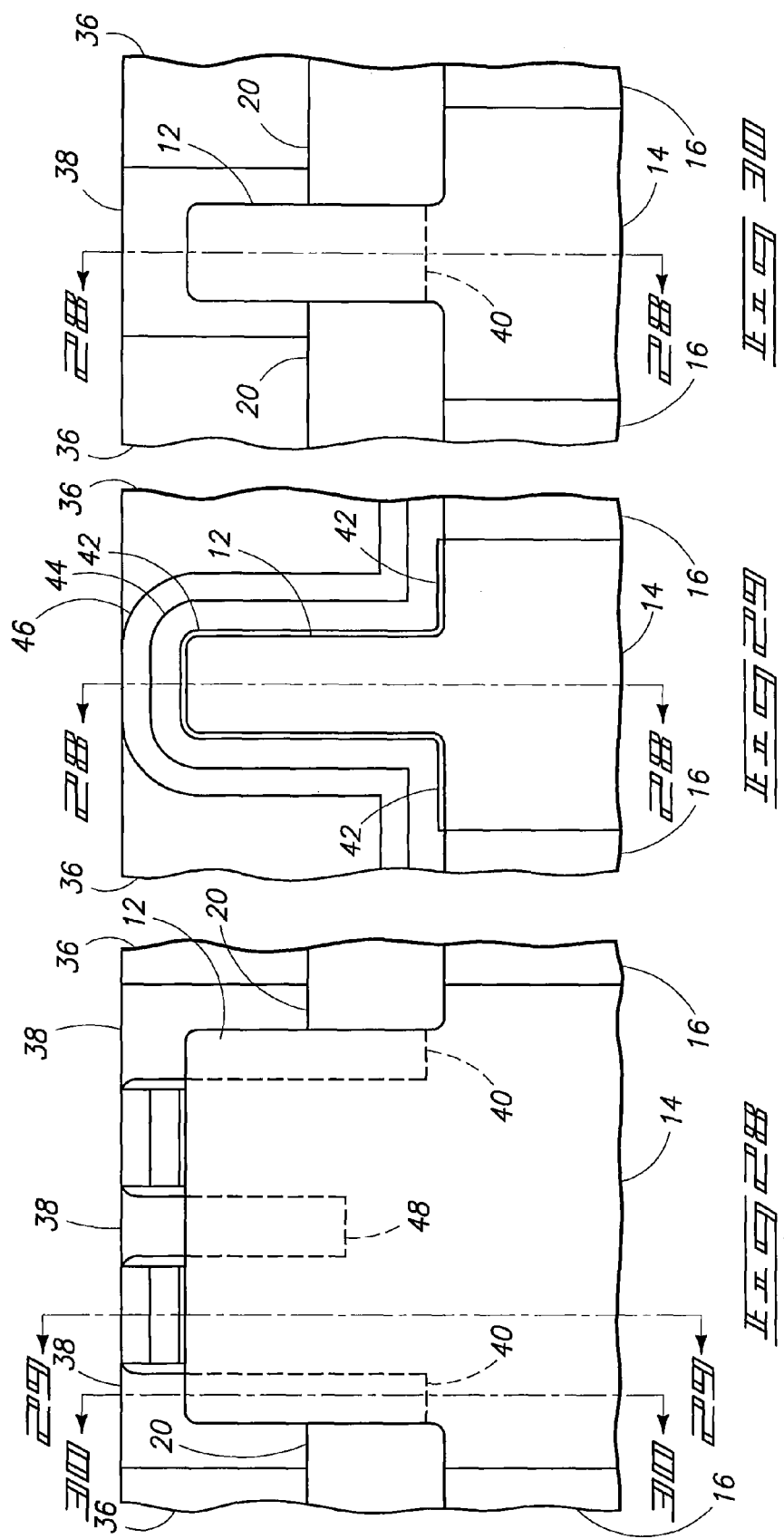

TRANSISTOR FORMING METHODS

CROSS REFERENCE TO RELATED APPLICATION

This application is a continuation of U.S. patent application Ser. No. 12/234,438, filed on Sep. 19, 2008, now U.S. Pat. No. 7,608,495, which is incorporated herein by reference.

RELATED PATENT DATA

Technical Field

The embodiments described herein pertain to methods of forming transistors, such as the known "finFET" type of transistor.

Background

Gate induced drain leakage (GIDL) constitutes a significant hurdle for implementation of fin field effect transistor (finFET) technology, such as when using p+ polysilicon for the gate. GIDL constitutes an off-state leakage mechanism that occurs with the gate turned off and a "1" stored in a cell associated with the transistor. GIDL is directly proportional to the gate-to-active area overlap for the access device and occurs along a shortest path between the gate and drain. GIDL may increase due to a work function difference between a p+ polysilicon gate and a n+ active area.

FIG. 32 shows a known finFET device where a fin 152 etched from an active area island 154 extends between a source region 162 and a drain region 164 of island 154. A drain junction 168 between drain region 164 and the underlying semiconductor of island 154 shows a deeper impurity region for drain 164 in comparison to the impurity region for source 162 shown by a source junction 166. Plugs 160 contacting source region 162 and drain region 164 are also shown.

A word line (not shown for simplicity) would occupy a trench 158 defining fin 152 between source region 162 and drain region 164. Plugs 160 would be electrically separated from such a word line at least by insulative spacers (which also are not shown) on sidewalls of the word line. An overlap area 170 designated by hatching on the surface of drain region 164 demonstrates the gate-to-active area overlap that would exist between a word line and drain region 164. Overlap area 170 is bounded on the bottom by drain junction 168 and on the sides and top by the physical dimensions of drain region 164.

US Patent Publication No. 2008/0099850 to Jeon describes reduction of GIDL using various complex transistor structures and processing. Jeon, as well as U.S. Pat. No. 7,026,199 to Lee and US Patent Publication No. 2008/0048262 to Lee describe fins having common dimensions in the channel region over which the word line is formed as well as the source region and drain region. Essentially, the source, channel, and drain are all in the fin. One effect of providing a fin with common dimensions for the source region, the drain region and the channel includes reducing the gate-to-active area overlap.

However, indications exist that the complex structures and processes of forming known finFET devices suffer from difficulty in implementation and little tolerance for defects. Consequently, possibilities remain for better methods of forming transistors with reduced gate-to-active area overlap and better resulting structures.

BRIEF DESCRIPTION OF THE DRAWINGS

FIGS. 1-3 show a top view and cross-sectional views taken along lines shown in FIG. 1 of an in-process double-gate finFET according to one embodiment at a processing stage.

FIGS. 7-10 show a top view and cross-sectional views taken along lines shown in FIG. 7 at a stage subsequent to that shown in FIGS. 4-6.

FIGS. 11-14 show a top view and cross-sectional views taken along lines shown in FIG. 11 at a stage subsequent to that shown in FIGS. 7-10.

FIGS. 15-18 show a top view and cross-sectional views taken along lines shown in FIG. 15 at a stage subsequent to that shown in FIGS. 11-14.

FIGS. 19-22 show a top view and cross-sectional views taken along lines shown in FIG. 19 at a stage subsequent to that shown in FIGS. 15-18.

FIGS. 23-26 show a top view and cross-sectional views taken along lines shown in FIG. 23 at a stage subsequent to that shown in FIGS. 19-22.

FIGS. 27-30 show a top view and cross-sectional views taken along lines shown in FIG. 27 at a stage subsequent to that shown in FIGS. 23-26.

DETAILED DESCRIPTION OF THE ILLUSTRATED EMBODIMENTS

Figure 4:
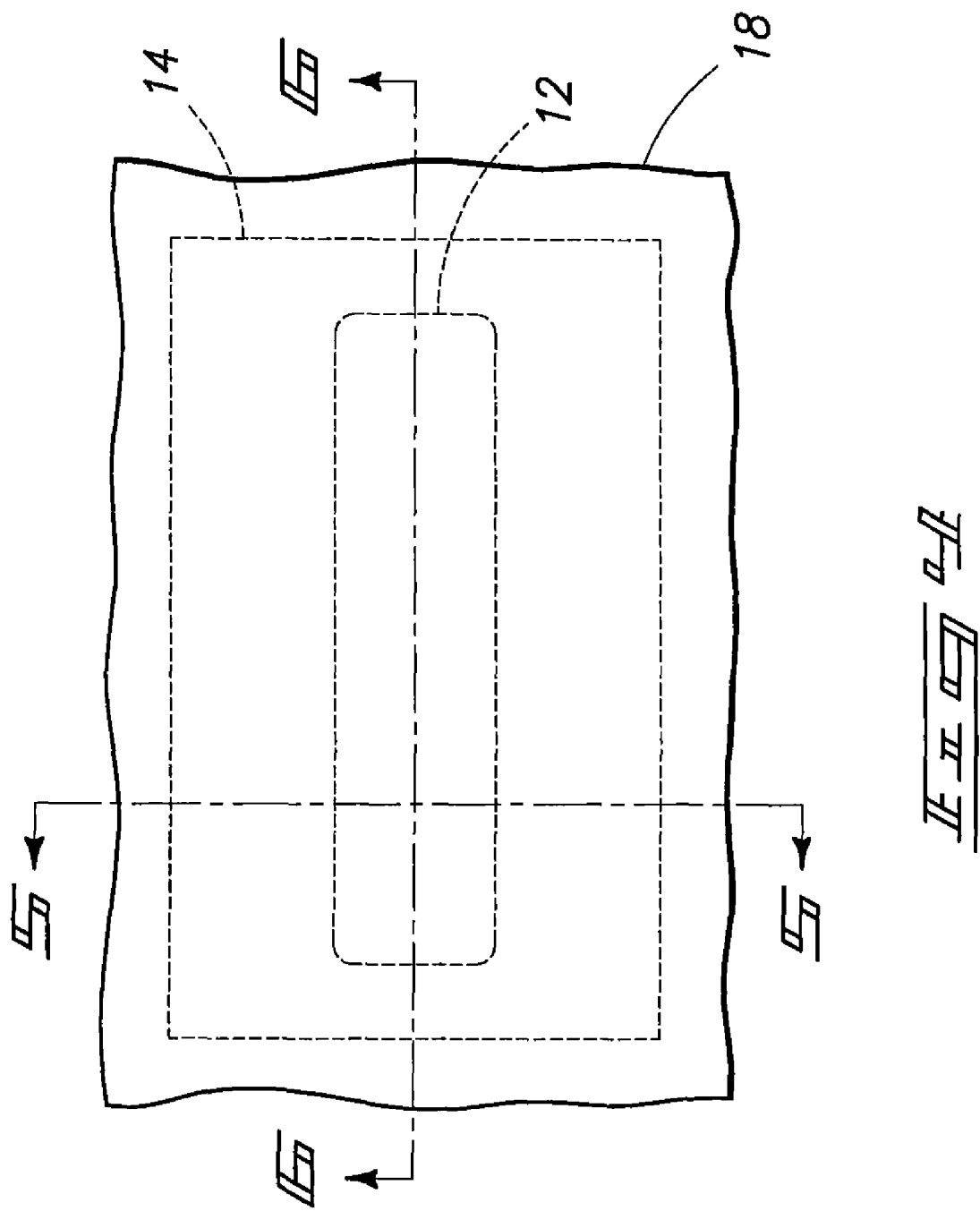
FIGS. 4-6 show a top view and cross-sectional views taken along lines shown in FIG. 4 at a stage subsequent to that shown in FIGS. 1-3.

The embodiments described herein allow implementation in the context of existing process flows with relatively simple modification. For example, up to the process stage shown in FIGS. 1-3, the method of formation may proceed as normal to prepare a semiconductor substrate and to form electrical isolation material, for example, shallow trench isolation, in the substrate to provide an active area island of semiconductor material laterally surrounded by the isolation material.

As shown in FIGS. 1-3, instead of merely etching the active area where a word line will be positioned, the entire island of semiconductor material may be etched to provide a fin 12. A trench 10 is formed, defining fin 12 of semiconductor material in an island 14. FIGS. 1-3 show the portions of island 14 and an isolation material 16 remaining after removing some of the semiconductor material of island 14 and after removing some of the material of isolation 16. Notably, a portion of island 14 remains at the bottom of trench 10. Known processes for removing some of island 14 and removing some of isolation material 16 may be used with modification of masking steps or of other steps of selection of material to be removed so that fin 12 results. Since embodiments include forming an array of like transistors, it will be appreciated that isolation material 16 may separate island 14 from neighboring active area islands (not shown).

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 6:
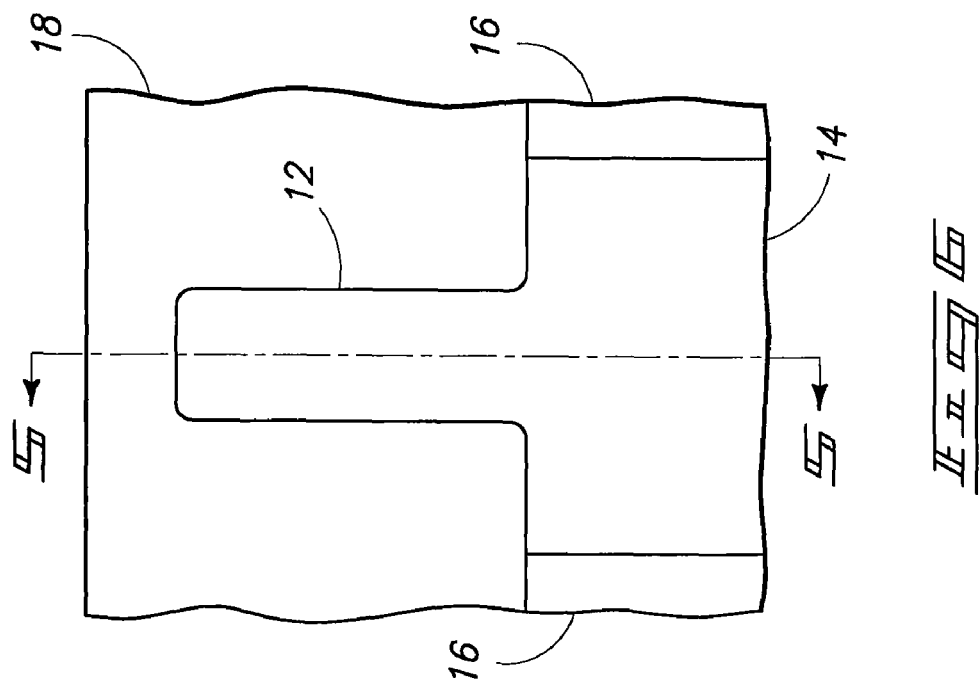
Figure 5:
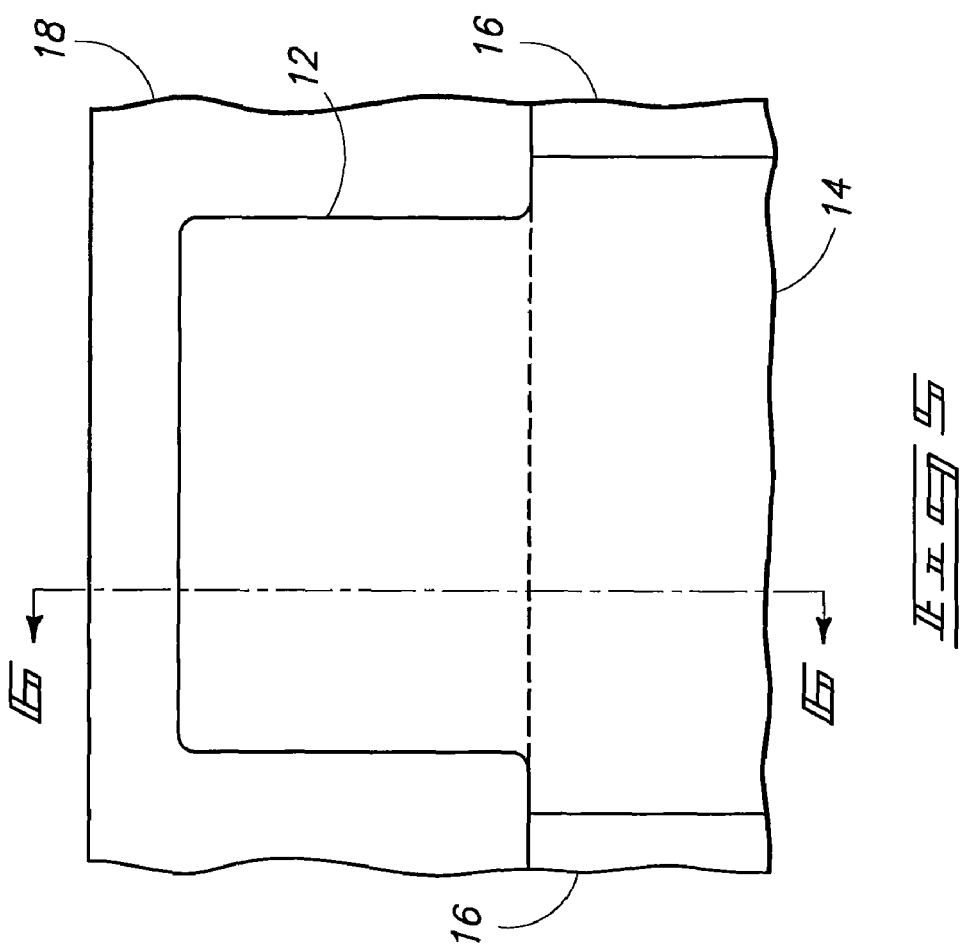
Figure 10:
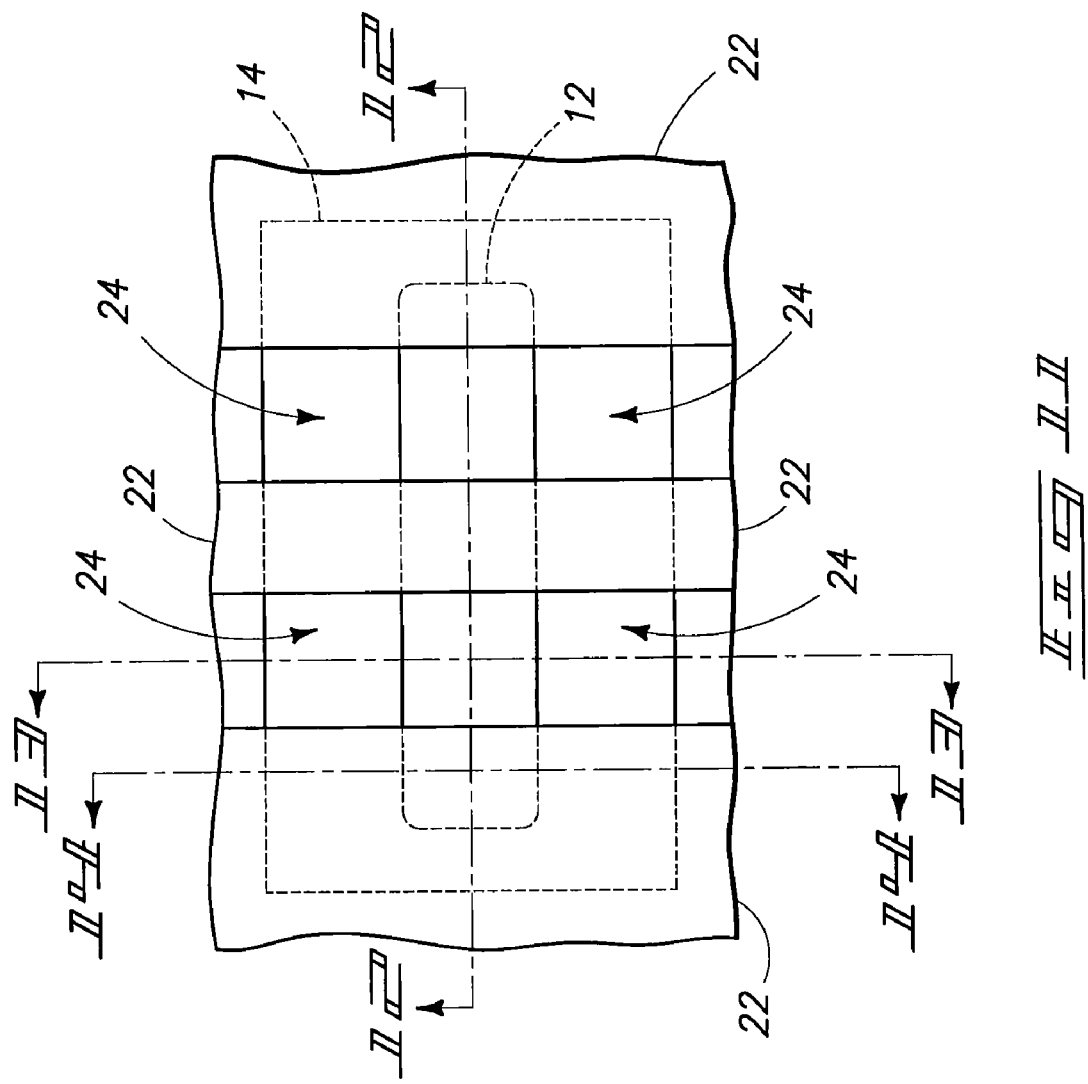
Figure 19:
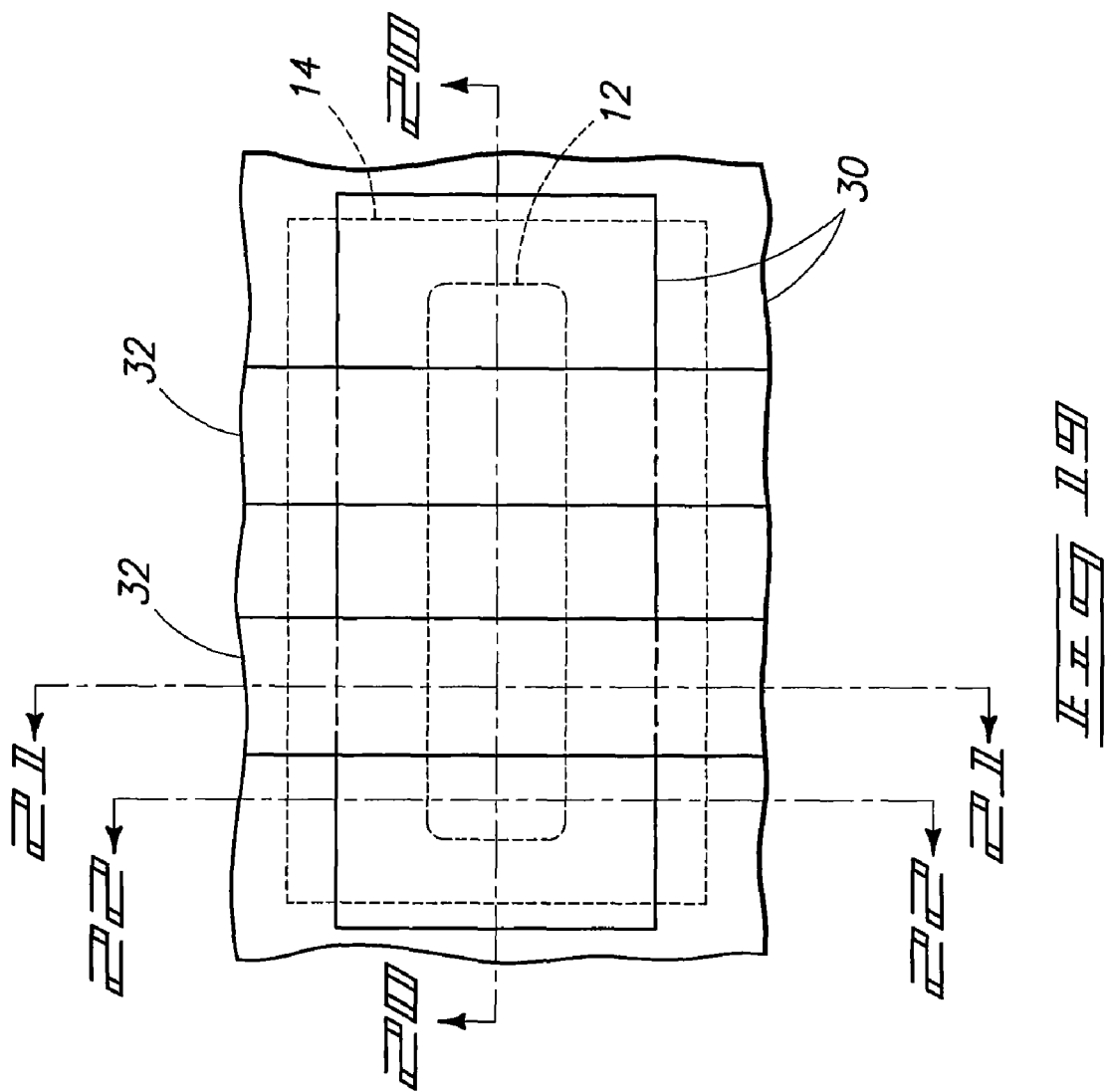

FIGS. 4-6 show a subsequent process stage after forming a dielectric spacer material 18 over island 14 and isolation 16, for example, by blanket deposition over all of island 14. Examples of suitable spacer materials include a nitride, e.g. $Si_3N_4$, or an oxide, e.g. $SiO_2$. In FIGS. 7-10, some of spacer material 18 is removed, for example, by known etch back techniques to provide a spacer 20 in trench 10 laterally surrounding fin 12. Other techniques for forming spacer 20 may be used instead of a deposit/etch back type of process. Spacer 20 has a thickness less than a height of fin 12 above a bottom of trench 10 so that some of the semiconductor material of fin 12 is exposed elevationally above the thickness of spacer 20. Fin 12 may have a height of from 70 to 120 nanometers (nm) and spacer 20 may have a height of from 20 to less than 70 nm.

As will be appreciated from the further discussion herein, thickness of spacer 20 may be varied to provide a desired offset of subsequently formed source/drain plugs above the semiconductor material at the bottom of trench 10. Also, thickness of spacer 20 may determine a height of fin 12 available for contact with the source/drain plugs. Consequently, at least some of the height of fin 12 may be exposed elevationally above the thickness of spacer 20.

FIGS. 11-14 show the remainder of a mask 22 after patterning of mask 22 and, using the mask pattern, removing a portion of spacer 20 to form line openings 24 through spacer 20. Mask 22 may be a photoresist mask or other suitable masking material known in the art. Line openings 24 expose some of the semiconductor material of island 14 appearing at the bottom of trench 10 in FIGS. 1-3 and expose some of the semiconductor material of opposing sidewalls of fin 12 previously covered by spacer 20. As appreciated from FIGS. 11-14 and subsequent figures, mask 22 defines line openings 24 in regions where a gate line will be formed over a channel in fin 12.

The structure of FIGS. 15-18 results after formation of a gate dielectric material 26, a gate stack material 28, and a gate cap material 30 in line openings 24 as well as over all of island 14. Among other techniques, gate dielectric material 26 may be formed by known techniques for growing gate oxide on the exposed semiconductor surfaces. Gate stack material 28, such as polysilicon, and gate cap material 30, such as silicon nitride, may also contain known materials and be formed by known techniques in keeping with the concept of using existing process flows where possible. Other suitable compositions for gate stack material 28 include tungsten and tungsten silicide.

FIGS. 19-22 shows a mask 32 after formation and patterning. Mask 32 may be a photoresist mask and blocks portions of gate dielectric material 26, gate stack material 28, and gate cap material 30 intended to remain as part of two gate lines. Excess portions of the gate materials may be removed, for example, by known etching techniques to provide the structures shown in FIGS. 23-26. Spacers 34 of gate insulation may be formed on sidewalls of the remaining gate materials, namely, gate dielectrics 42, gate stacks 44, and gate caps 46. Known techniques of blanket depositing an insulative material followed by anisotropic etching to form spacers may be used, among other techniques.

As is apparent, gate lines are thus formed on and in contact with the semiconductor material exposed above spacer 20 and the semiconductor material of island 14, including opposing sides of fin 12, exposed through line openings 24. The gate lines extend through line openings 24, over opposing sidewalls of fin 12, and over the top of fin 12. Forming the gate lines through line openings 24 increases the area of gate control of a channel in fin 12 since more of the height of fin 12 is operationally associated with the gate lines than if line openings 24 were not formed. Even so, spacer 20 remains in place in areas where it performs the functions described herein.

Although not shown in the Figures, gate dielectric material 26 could be left in place at the process stage of FIGS. 23-26 and subsequently removed, at least partially, to expose source/drain regions at the time of forming source/drain plugs contacting fin 12. Also, instead of depositing gate materials 26, 28, 30 over all of island 14 followed by masking and etching them, other formation techniques are conceivable.

An interlayer dielectric 36 may be formed over island 14 and isolation 16 followed by forming contact openings (not shown) through dielectric 36 exposing portions of fin 12 intended to comprise source/drain regions and exposing at least a portion of spacer 20 proximate the exposed portions of fin 12. The material of spacer 20 may be selected so as to function as an etch stop for formation of contact openings. For example, when spacer 20 contains silicon nitride and dielectric 36 contains borophosphosilicate glass (BPSG), known techniques, such as a wet etch using hydrofluoric acid, may be used for etching selective to dielectric 36 and stopping on spacer 20. Dielectric 36 could alternatively consist of $SiO_2$ and be similarly etched.

Using the contact openings, impurities may be provided in exposed portions of fin 12 to form source/drain regions 40, 48. Impurities may be provided, for example, by known ion implantation techniques. Notably, the junction of a source region 48 with the semiconductor material of island 14 in FIG. 28 is elevated with respect to the junctions of drain regions 40 with the semiconductor material. Consistent with known practice, source region 40 may constitute a shared source region for a double-gate finFET and drain regions 40 may provide more deeply implanted regions. Despite the deep drain regions, the gate lines formed by gate dielectrics 42, gate stacks 44, and gate caps 46 do not overlap an active area so as to produce GIDL.

Conductive material, for example, conductively doped polysilicon, may be formed within the contact openings and planarized to provide plugs 38. As is apparent from FIGS. 27-30, plugs 38 in contact with drain regions 40 contact the exposed portion of spacer 20 and are in electrical connection with the top, one of the opposing end walls, and both of the opposing sidewalls of fin 12. Also, plug 38 in contact with source region 48 is in contact with the exposed portion of spacer 20 and is in electrical connection with the top and both of the opposing sidewalls of fin 12. The increased contact area of plugs 38 with source/drain regions 40, 48 assists in decreasing contact resistance in comparison to plugs that only electrically connect with the top of fin 12 or only electrically connect with an endwall of fin 12.

Figure 31:
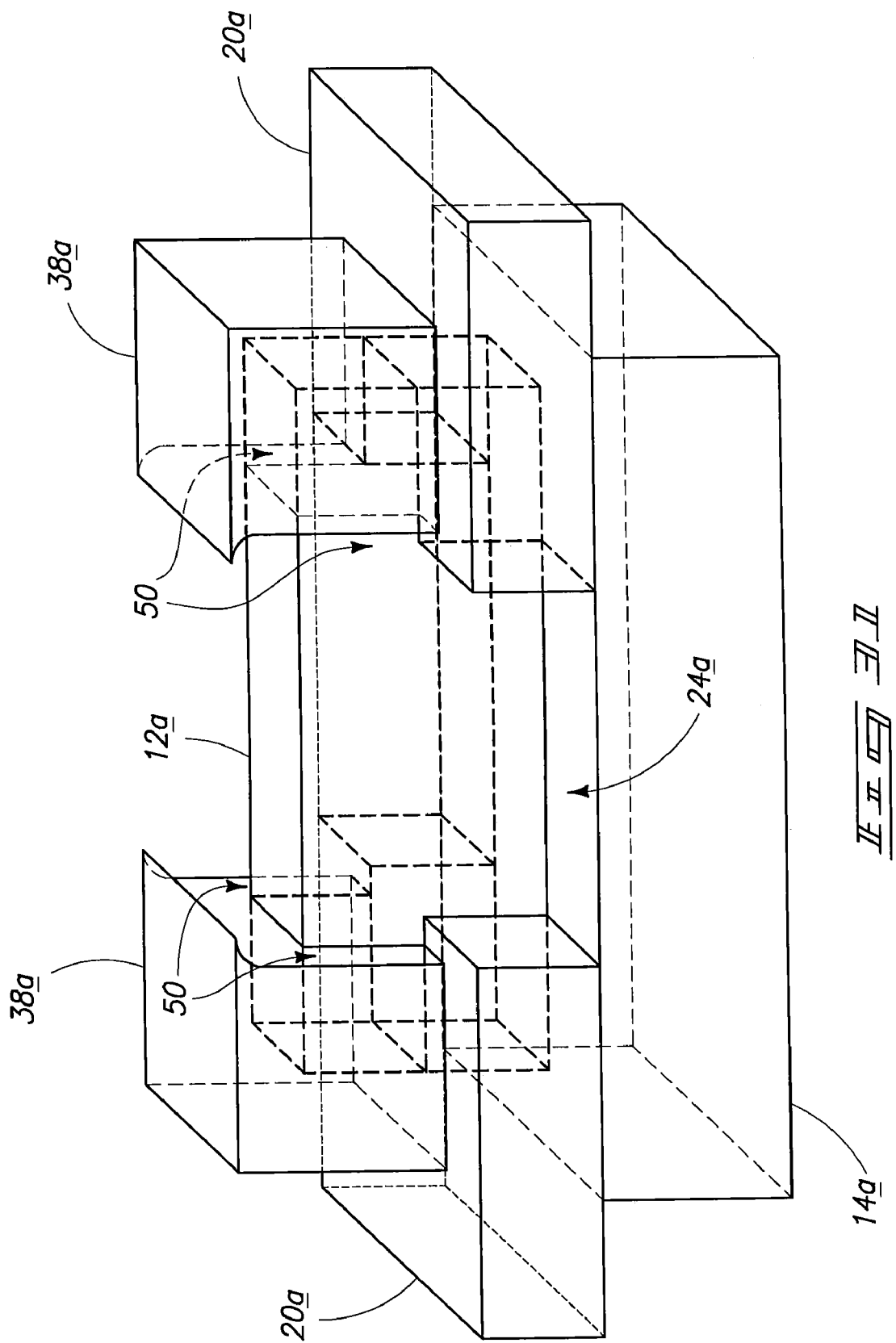
FIG. 31 shows a perspective view of single-gate finFET device analogous to the double-gate finFET device shown in FIGS. 27-30 with some structures removed to show discussed features.

FIG. 31 shows a perspective view of a single-gate finFET device analogous to the double-gate finFET device shown in FIGS. 27-30. That is, the structure of FIG. 31 shows a spacer 20a around a portion of a fin 12a and line openings 24a through spacer 20a exposing some of the semiconductor material of an island 14a, including opposing sidewalls of fin 12a. Plugs 38a are both in electrical connection with the top, one of the opposing endwalls, and both of the opposing sidewalls of fin 12a. Source/drain region junctions with semiconductor material of island 14a are not shown in FIG. 31 for simplification purposes. However, one of plugs 38a may contact a source region and the other of plugs 38a may contact a drain region of fin 12a. The portion of fin 12a between such source/drain regions may constitute a channel of a finFET. Understandably then, structures forming a gate line, such as gate dielectrics 42, gate stacks 44, and gate caps 46 shown in FIGS. 27-30 may be formed over fin 12*a* to provide a gate line for a single-gate finFET in a manner analogous to that shown in FIGS. 27-30 for a double-gate finFET.

As is apparent from plugs' 38*a* shapes adjacent a gate line that would be so formed, gaps 50 exist between plugs 38*a* and the gate line where plugs 38*a* are set back from the edges of spacer 20*a* adjacent the gate line. Thus, gate line insulation, such as spacers 34, may be accommodated in gaps 50, insulating plugs 38*a* from the gate line. Such gate line insulation extends from the tops of spacer 20*a* up over opposing sides of fin 12*a* and over the top of fin 12*a*. The sectional views of FIGS. 27-30 do not make the extent of spacers 34 clear for plugs 38 contacting source/drain regions 40, 48 (though it would be inherent from the processes and structures otherwise described). However, the extent of such spacers is apparent from gaps 50 in FIG. 31 for gate line insulation formed in an analogous method.

Other reductions in drain leakage include reducing the interface area of the junction between the drain regions and the semiconductor substrate. Since the interface area of the drain junction for the transistor of FIG. 31 is less in comparison to the interface area of the drain junction for the transistor of FIG. 32, there is less leakage. The same is true for the transistors of FIGS. 27-30, as afforded by the structure of fins 12 and 12*a*.

In the absence of spacers 20 or 20*a*, plugs 38 or 38*a* are free to extend down and contact the semiconductor material of islands 14 or 14*a*. Such contact may essentially increase the interface area of the junction between the drain regions and the semiconductor substrate, increasing leakage. Consequently, spacers 20 or 20*a* allow separation of plugs 38 or 38*a* from the semiconductor material of islands 14 or 14*a* and maintain the lesser amount of leakage afforded by the structure of fins 12 and 12*a*. Without spacers 20 or 20*a* it is conceivable that the structure of fins 12 or 12*a* might not actually decrease leakage.

Figure 32:
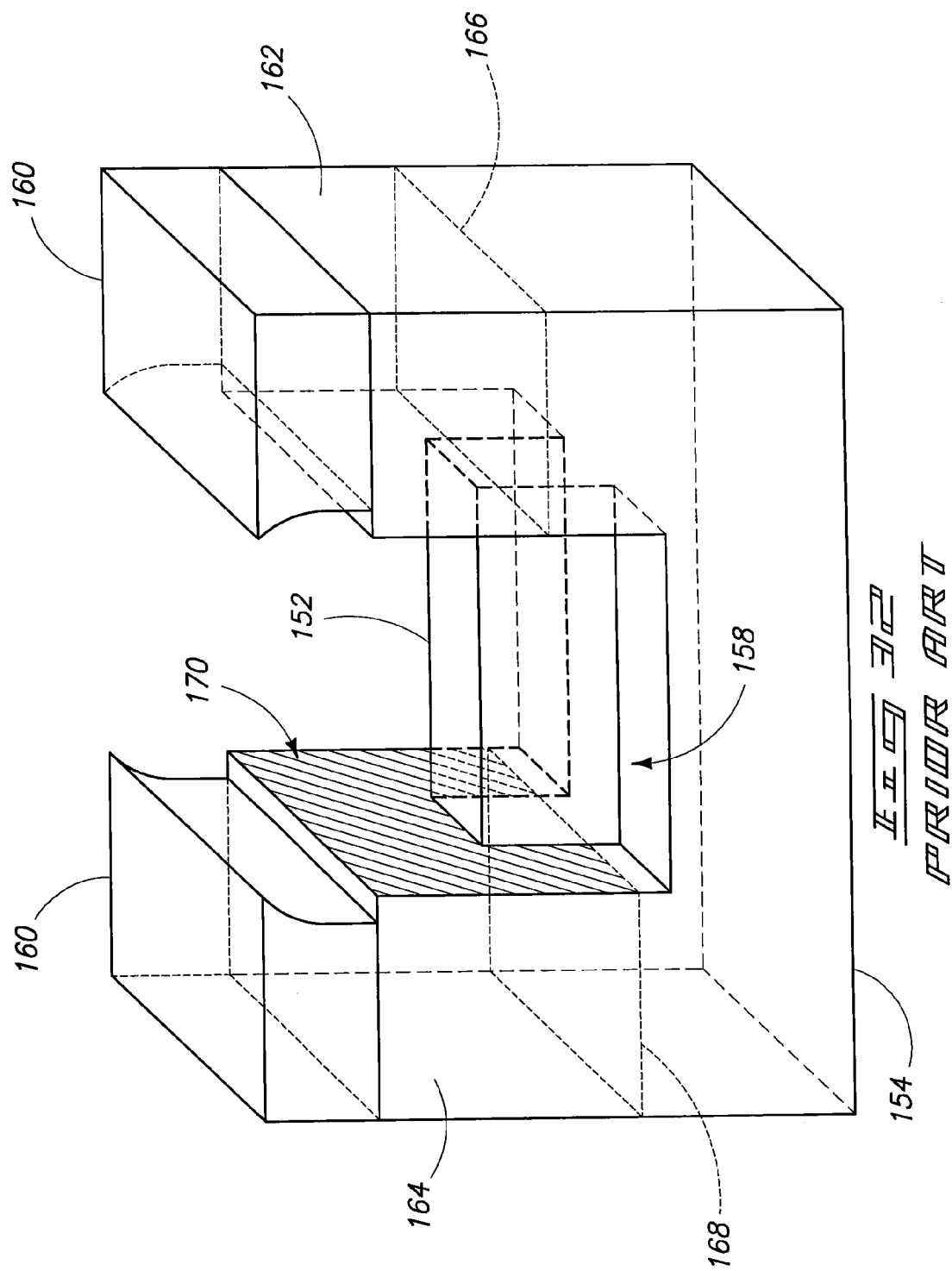
FIG. 32 shows a perspective view of a known finFET device with some structures removed to show discussed features.

Comparison of FIG. 31 and FIG. 32 also reveals a smaller overhead area for plugs 38*a* in comparison to plugs 160. Thus, contact openings provided for the structures in FIG. 31 may have a smaller diameter. Even so, it will be appreciated that the contact area of plugs 38*a* to source/drain regions of fin 12*a* is not necessarily less than the contact area of plugs 160 to source/drain regions 162, 164 since they contact the top, both opposing sidewalls, and one endwall of fin 12*a*. Indeed, the diameter of contact openings for plugs 38 or 38*a* might be reduced without reducing the contact area of such plugs with source/drain regions. Such plugs may be contrasted with the teachings of the references discussed in the Background section above, which do not describe four-sided contact with source/drain regions.

In one embodiment, a transistor forming method includes forming an island of semiconductor material laterally surrounded by electrical isolation material in a semiconductor substrate. The method includes removing some of the semiconductor material of the island and forming a trench defining a fin of semiconductor material in the island. The fin has a top, opposing sidewalls, and opposing endwalls and a portion of the island remains at a bottom of the trench. After forming the trench, a dielectric spacer is formed in the trench over the bottom, the opposing sidewalls, and the opposing endwalls and laterally surrounding the fin. The spacer has a thickness and some of the semiconductor material of the fin is exposed elevationally above the spacer thickness.

The method includes forming line openings through the spacer and exposing through the line openings some of the semiconductor material of the island at the bottom of the trench and some of the semiconductor material of the opposing sidewalls of the fin. A gate line is formed on and in contact with the semiconductor material exposed above the spacer and the semiconductor material exposed through the line openings. The gate line extends through the line openings, over the opposing sidewalls, and over the top of the fin. Source/drain regions are formed in the fin in operational association with the gate line.

By way of example, and in addition to options described herein for other embodiments, the island may have a length greater than its width and the fin may have a length greater than its width. The fin's length may be less than the island's length and the fins width may be less than the islands width. Also, the fin may be laterally centered in the island. The trench may laterally surround the fin and extend laterally from the fin at least to an outermost peripheral edge of the island. Understandably, the trench may extend beyond the outermost peripheral edge of the island. That is, the forming of the trench may include simultaneously etching the isolation material laterally surrounding the island and some of the semiconductor material of the island to a same elevational level as the bottom of the trench.

The spacer may extend laterally from the fin at least to an outermost peripheral edge of the island. Also, the spacer may extend beyond the outermost peripheral edge of the island. A spacer so extending is likely when the forming of the transistor includes forming an array of islands and transistors of like construction. The spacer thus essentially fills trenches between the transistors except where line openings are formed through the spacer. The line openings may expose semiconductor material of the island at the bottom of the trench, as indicated above, and may also expose isolation material at the bottom of the trench outside the outermost peripheral edge of the island. The gate line may be a word line further extending across the isolation material to another of the transistors.

The forming of the spacer may include blanket depositing a dielectric spacer material over all of the island and etching back some of the dielectric spacer material. The forming of the gate line may include forming a gate dielectric material on and in contact with the semiconductor material exposed above the spacer and the semiconductor material exposed through the line openings. A gate stack material may be formed over the gate dielectric material, a gate cap material may be formed over the gate stack material, and a gate line may be formed from the gate dielectric material, gate stack material, and gate cap material. The method may further include forming insulation on opposing sidewalls of the gate line before forming the source/drain regions.

To the extent that formation of the gate dielectric material depends on the presence of semiconductor material, as in gate oxidation techniques, the gate line might extend across the isolation material less the gate dielectric. If the gate dielectric material does not form on the isolation material, as in FIGS. 15-18, then the gate dielectric might not extend across the isolation material along with the other gate materials.

In another embodiment, a transistor forming method includes forming an island of semiconductor material laterally surrounded by electrical isolation material in a semiconductor substrate. The method includes removing some of the semiconductor material of the island and forming a trench defining a fin of semiconductor material in the island. The fin has a top, opposing sidewalls, and opposing endwalls and a portion of the island remains at a bottom of the trench. After forming the trench, a dielectric spacer is formed in the trench over the bottom, the opposing sidewalls, and the opposing endwalls and laterally surrounding the fin. The spacer has a thickness and some of the semiconductor material of the fin is exposed elevationally above the spacer thickness. The method includes forming a gate line on and in contact with the semiconductor material exposed above the spacer. The gate line extends over the opposing sidewalls and over the top of the fin.

The method includes forming an interlayer dielectric over areas of the fin intended for source/drain regions and forming contact openings through the interlayer dielectric. Areas intended for source/drain regions are exposed along with at least a portion of the spacer proximate the areas. Source/drain regions are formed in the fin in operational association with the gate line. The method includes forming a source/drain plug in contact with the exposed portion of the spacer and in electrical connection with the top, one of the opposing endwalls, and both of the opposing side walls of the fin of one of the source/drain regions. The method includes forming another source/drain plug in contact with the exposed portion of the spacer and in electrical connection with at least the top and both of the opposing side walls of the fin of another of the source/drain regions.

By way of example, and in addition to options described herein for other embodiments, the method may further include forming line openings through the spacer and exposing through the line openings some of the semiconductor material of the island at the bottom of the trench and some of the semiconductor material of the opposing side walls of the fin. The gate line may also be formed on and in contact with the semiconductor material exposed through the line openings. The gate line may extend through the line openings, over the opposing side walls, and over the top of the fin.

The spacer thickness may constitute a height offset between the source/drain plugs and the semiconductor material of the islands at the bottom of the trench. Most of a height of the fin above the bottom of the trench may be elevationally above the spacer thickness. Forming the gate line may include forming a gate dielectric material on and in contact with the semiconductor material exposed above the spacer, forming a gate stack material on and contact with the gate dielectric material, and forming a gate cap material on and in contact with the gate stack material. After blocking with a mask, a gate line may be etched from the gate dielectric material, gate stack material, and gate cap material.

Gate line insulation may be formed on the opposing side walls of the gate line and the contact openings may be self-aligned to the source/drain regions at least by the gate line insulation. The forming of the transistor may include forming an array of islands and transistors of like construction. The spacer may extend across the isolation material between the transistors and the gate line may be a word line further extending across the spacer to another of the transistors.

The forming of the transistor may include forming a double-gated transistor. The one of the source/drain regions may include a drain region, the other of the source/drain regions may include a source region shared between two gates. The forming of the double-gated transistor may include forming another drain plug in contact with an exposed portion of the spacer and in electrical connection with the top, another of the opposing endwalls, and both of the opposing side walls of the fin of another exposed drain region.

As may be appreciated from description of the Figures and discussion of the embodiments herein, better methods of forming transistors with reduced gate-to-active area overlap are provided. Essentially, a dielectric spacer may be formed around the fin, providing an etch stop for formation of contact openings to areas intended for source/drain regions and offsetting source/drain plugs above the semiconductor material of the active area island. Contact openings may be formed large enough so that source/drain plugs electrically connect with at least the top of the fin as well as opposing sides. Contact openings in proximity with endwalls of the fin further allow electrical connection with endwalls in addition to the top and opposing side walls. The described embodiments may be provided in known process flows by implementing relatively simple changes in forming the fin and/or adding a dielectric spacer. The diameter of contact openings might be reduced without reducing the contact area of source/drain plugs with source/drain regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A transistor forming method comprising:
   providing an island of semiconductor material laterally surrounded by electrical isolation material in a semiconductor substrate, the island having a fin of semiconductor material and the fin having a top, opposing sidewalls, and opposing endwalls and a portion of the island extending from the fin to an edge of the island;
   forming a dielectric spacer around the fin and over the portion of the island between the fin and the edge of the island, over the opposing sidewalls, and over the opposing endwalls, the spacer having a thickness and some of the semiconductor material of the fin being exposed elevationally above the spacer thickness;
   forming line openings through the spacer and exposing through the line openings some of the semiconductor material between the fin and the edge of the island and some of the semiconductor material of the opposing sidewalls of the fin;
   forming a gate line on and in contact with the semiconductor material exposed above the spacer and the semiconductor material exposed through the line openings, the gate line extending through the line openings, over the opposing sidewalls, and over the top of the fin; and
   in operational association with the gate line, forming source/drain regions in the fin.

2. The method of claim 1 wherein the spacer laterally surrounds the fin and extends laterally from the fin at least to an outermost peripheral edge of the island.

3. The method of claim 1 wherein the gate line comprises a gate dielectric, a gate stack, and a gate cap.

4. The method of claim 1 wherein the forming of the transistor comprises forming an array of islands and transistors of like construction and the gate line is a word line further extending across the isolation material to another of the transistors.

5. A transistor forming method comprising:
   providing an island of semiconductor material laterally surrounded by electrical isolation material in a semiconductor substrate, the island having a fin of semiconductor material and the fin having a top, opposing sidewalls, and opposing endwalls;
   forming a dielectric spacer around the fin and over the opposing sidewalls and the opposing endwalls, the spacer having a thickness and some of the semiconductor material of the fin being exposed elevationally above the spacer thickness;

forming a gate line on and in contact with the semiconductor material exposed above the spacer, the gate line extending over the opposing sidewalls and over the top of the fin;

forming an interlayer dielectric over areas of the fin intended for source/drain regions and over the spacer;

forming contact openings through the interlayer dielectric and exposing the areas intended for source/drain regions and at least a portion of the spacer proximate the areas, the spacer providing an etch stop for the forming of the contact openings;

in operational association with the gate line, forming the source/drain regions in the fin; and forming source/drain plugs through the contact openings in contact with the exposed portions of the spacer and in electrical connection with at least the top and both of the opposing sidewalls of the fin of the source/drain regions.

6. The method of claim 5 wherein a portion of the island extends from the fin to an edge of the island.

7. The method of claim 6 further comprising forming line openings through the spacer and exposing through the line openings some of the semiconductor material of the island between the fin and the edge of the island and some of the semiconductor material of the opposing sidewalls of the fin, wherein the gate line is also formed on and in contact with the semiconductor material exposed through the line openings, the gate line extending through the line openings, over the opposing sidewalls, and over the top of the fin.

8. The method of claim 5 wherein the spacer laterally surrounds the fin.

9. The method of claim 5 wherein the gate line comprises a gate dielectric, a gate stack, and a gate cap.

10. The method of claim 5 wherein at least one of the source/drain plugs is in electrical connection with the top, one of the opposing endwalls, and both of the opposing sidewalls of the fin of one of the source/drain regions.

11. The method of claim 5 wherein providing the island having the fin comprises removing some of semiconductor material of the island and forming a trench defining the fin of semiconductor material in the island, a portion of the island remaining at a bottom of the trench.

12. The method of claim 11 wherein the forming of the trench comprises simultaneously etching the isolation material laterally surrounding the island and some of the semiconductor material of the island to a same elevational level as the bottom of the trench.

13. The method of claim 11 wherein most of a height of the fin above the bottom of the trench is elevationally above the spacer thickness.

14. The method of claim 5 wherein the spacer thickness constitutes a height offset between the source/drain plugs and the semiconductor material of the island.

15. The method of claim 5 wherein the island has a length greater than its width, the fin has a length greater than its width, the fin's length is less than the island's length, the fin's width is than the island's width, and the fin is laterally centered in the island.

16. The method of claim 5 wherein the forming of the spacer comprises blanket depositing a dielectric spacer material over all of the island and etching back some of the dielectric spacer material.

17. The method of claim 5 wherein forming the gate line comprises:

forming a gate dielectric material on and in contact with the semiconductor material exposed above the spacer;

forming a gate stack material on and in contact the gate dielectric material;

forming a gate cap material on and in contact the gate stack material; and blocking with a mask and etching a gate line from the gate dielectric material, gate stack material, and gate cap material.

18. The method of claim 5 further comprising forming gate line insulation on opposing sidewalls of the gate line before forming the source/drain regions.

19. The method of claim 5 wherein the forming of the transistor comprises forming an array of islands and transistors of like construction, the spacer extends across the isolation material between the transistors, and the gate line is a word line further extending across the spacer to another of the transistors.

20. The method of claim 5 wherein the forming of the transistor comprises forming a double-gated transistor, one of the source/drain regions comprising a drain region, another of the source/drain regions comprising a source region shared between two gates, and the forming of the double-gated transistor comprising forming another drain plug in contact with an exposed portion of the spacer and in electrical connection with the top, another of the opposing endwalls, and both of the opposing sidewalls of the fin of another exposed drain region.

* * * * *